United States Patent
Friedrich et al.

(10) Patent No.: US 7,883,645 B2
(45) Date of Patent: *Feb. 8, 2011

(54) METHOD FOR INCREASING THE CONVERSION OF GROUP III METALS TO GROUP III NITRIDES IN A FUSED METAL CONTAINING GROUP III ELEMENTS

(75) Inventors: Jochen Friedrich, Eckental (DE);
Georg Muller, Langensendlbach (DE);
Elke Meissner, Eckental (DE);
Bernhard Birkmann, Cadolzburg (DE);
Stephan Hussy, Nuremberg (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 64 days.

This patent is subject to a terminal disclaimer.

(21) Appl. No.: 11/664,370

(22) PCT Filed: Oct. 4, 2005

(86) PCT No.: PCT/DE2005/001772
§ 371 (c)(1),
(2), (4) Date: Feb. 10, 2008

(87) PCT Pub. No.: WO2006/037311
PCT Pub. Date: Apr. 13, 2006

(65) Prior Publication Data
US 2008/0290327 A1 Nov. 27, 2008

(30) Foreign Application Priority Data
Oct. 5, 2004 (DE) .................. 10 2004 048 453

(51) Int. Cl.
*H01B 1/02* (2006.01)

(52) U.S. Cl. .................. 252/521.5; 252/502; 252/503; 117/1; 117/2; 117/3; 117/4; 117/73; 117/77; 117/86; 117/89

(58) Field of Classification Search .................. 117/77, 117/89, 86, 1–4, 73; 220/62.11; 252/62.3, 252/500, 502, 503, 521.5; 257/76; 438/483, 438/493
See application file for complete search history.

(56) References Cited

U.S. PATENT DOCUMENTS 3,811,963 A  5/1974  Hawrylo et al. ............. 148/172

(Continued)

FOREIGN PATENT DOCUMENTS

DE  199 29 591 A1  1/2004

(Continued)

OTHER PUBLICATIONS

Logan et al., "Heteroepitaxial Thermal Gradient Solution Growth of GaN," J. Electrochem. Soc., Solid-State Science and Technology, vol. 119, No. 12, Jun. 1973, pp. 1727-1734.*

(Continued)

*Primary Examiner*—Mark Kopec
*Assistant Examiner*—Khanh Tuan Nguyen
(74) *Attorney, Agent, or Firm*—Renner Kenner Greive Bobak Taylor & Weber

(57) ABSTRACT

The present invention relates to a method for increasing the conversion of group III metal to group III nitride in a fused metal containing group III elements, with the introduction of nitrogen into the fused metal containing group III, at temperatures $\leq 1100°$ C. and at pressures of below $1 \times 10^8$ Pa, wherein a solvent adjunct is added to the fused metal containing group III elements, which is at least one element of the following elements C, Si, Ge, Fe, and/or at least one element of the rare earths, or an alloy or a compound of these elements, in particular their nitrides.

12 Claims, 2 Drawing Sheets

U.S. PATENT DOCUMENTS

| | | | |
|---|---|---|---|
| 5,122,845 A * | 6/1992 | Manabe et al. | 257/76 |
| 5,637,531 A * | 6/1997 | Porowski et al. | 117/89 |
| 6,273,948 B1 * | 8/2001 | Porowski et al. | 117/77 |
| 6,562,124 B1 | 5/2003 | Ivantzov et al. | 117/29 |
| 7,256,110 B2 * | 8/2007 | Sasaki et al. | 438/493 |
| 7,553,368 B2 * | 6/2009 | Butcher et al. | 117/86 |
| 2003/0141301 A1 * | 7/2003 | D'Evelyn et al. | 220/62.11 |
| 2004/0144300 A1 | 7/2004 | Kitaoka et al. | 117/2 |
| 2004/0147096 A1 * | 7/2004 | Kitaoka et al. | 438/483 |
| 2004/0250747 A1 * | 12/2004 | Sasaki et al. | 117/2 |

FOREIGN PATENT DOCUMENTS

| | | |
|---|---|---|
| EP | 0 615 952 A2 | 9/1994 |
| EP | 1 754 811 | 2/2007 |
| JP | 06-016415 | 1/1994 |
| JP | 09 134878 | 5/1997 |
| JP | 2002-293696 | 9/2002 |
| JP | 2004-224600 | 8/2004 |
| WO | WO 95/04845 | 2/1995 |
| WO | WO 03/035945 A2 | 5/2003 |
| WO | WO 03/097532 A1 * | 11/2003 |
| WO | WO 2004/061923 A1 | 7/2004 |
| WO | WO 2006/037310 A1 | 4/2006 |
| WO | WO 2006/037311 A2 | 4/2006 |

OTHER PUBLICATIONS

Klemenz et al., "Crystal growth and liquid-phase epitaxy of gallium nitride," J. of Crystal Growth, 211, Month Unknown 2000, pp. 62-67.*

*Crystal Growth of FaN by the Reaction Between Gallium and Ammonia*—Elwell et al -Journal of Crystal Growth—Bd. 66, 1984, pp. 45-54.

*Synthesis of Gallium Nitride From Ammonium Chloride and Gallium*—Marinace—IBM Technical Disclosure Bulletin, IBM Corp. New York, US, Bd. 15, Nr. 5, Oct. 1972.

*Single-Crystalline Gallium Nitride Nanobelts*—B.S. Yong et al.—Applied Physics Letters, vol. 81, No. 1— Jul. 2002.

*Ain Single Crystals*—Slack et al—Journal of Crystal Growth 42 1977—pp. 560-563.

c:/epoquenetdata/eplogf/internal.log—Qinghua et al.

*Growth of nitride crystals, BN, AlN, and GaN by using a Na flux*—Yano et al—Diamond and Related Materials 9 (2000) 512-515.

*Growth of a Large GaN Single Crystal Using the Liquid Phase Epitaxy (LPE) Technique*—Kawamura—Jpn. J Appl. Phys. vol. 42 (2003) pp. L4-L6.

* cited by examiner

METHOD FOR INCREASING THE CONVERSION OF GROUP III METALS TO GROUP III NITRIDES IN A FUSED METAL CONTAINING GROUP III ELEMENTS

TECHNICAL FIELD

This invention relates to a method for increasing the conversion of group III metal to group III nitride in a fused metal containing group III elements. The method is used primarily in semiconductor technology, optoelectronics and high frequency technology for producing semiconductor components.

This method is used in particular for producing iso-structural group III nitride crystal layers or volume crystals (GaN, AlN, InN) or their mixed forms on iso-structural group III nitride crystal germs or on foreign substrates by precipitation from a fused metal containing group III elements.

STATE OF THE ART

Modern semiconductor components for optoelectronics, communications technology or high frequency technology, e.g. light emitting diodes or laser diodes, are frequently based on the semiconductor material system of the group III nitrides (GaN, AlN, InN, or their mixed crystals). To ensure that the material-specific advantages of nitride-based semiconductor components can be fully utilised, the nitride-based semiconductor components are precipitated on substrates which have the same lattice parameters as the group III nitrides themselves. Iso-structural group III nitride crystal layers, which are precipitated according to methods of prior art for solution cultivation or liquid phase epitaxy (LPE) from a fused metal containing group III elements in a gas atmosphere containing nitrogen in a substrate or germ, are therefore particularly suitable as substrates.

In this case the low conversion of group III metal to group III nitride in the liquid group III fused metal presents a particular problem that limits crystal growth. The conversion of group III metal to group III nitride can be influenced by the addition of solvent adjuncts to the group III fused metal.

Solvent adjuncts of prior art, which are used to increase the conversion of group III metal to group III nitride in the liquid group III fused metal, are the elements Li, Na and K. GaN crystals with dimensions of 1 to 6 mm have previously been cultivated from a fused metal containing Ga, particularly with the solvent adjuncts Na or K. However, the high steam pressure of sodium and potassium imposes a severe restricting on the cultivation of larger iso-structural group III nitride volume crystals and hence on the industrial implementation of this method.

Furthermore, the solvent adjuncts Bi and Sn are known from the article by D. Elwell et al. in the Journal of Crystal Growth 66 (1984) 45-54. However, attempts to produce sufficiently large iso-structural group III nitride crystals or substrates that are of suitable quality for industrial production have so far failed.

The elements described are used as used as solvents in solution cultivation processes which partially operate at high process pressures and temperatures. This requires considerable equipment expenditures and has disadvantages as far as controlled crystallisation of group III nitrides is concerned.

In summary, the solvent adjuncts of prior art for increasing the conversion of group III metal to group III nitride in a fused metal containing group III elements have the disadvantage that they only contribute to a small increase in the conversion of group III metal to group III nitride. Moreover, the equipment cost resulting from the use of high pressures and temperatures is considerable in some of the methods of prior art used for this purpose.

The object of this invention consists in indicating a method for increasing the conversion of group III metal to group III nitride in a fused metal containing group III elements at process pressures $<1\times10^8$ Pa and temperatures $<1100°$ C.

REPRESENTATION OF THE INVENTION

The object is achieved by the method according to claim 1, which describes a method for increasing the conversion of group III metal to group III nitride in a fused metal containing group III. Advantageous embodiments of the method constitute the object of the dependent claims and may be deduced from the description, particularly from the exemplary embodiment.

The method according to the invention for increasing the conversion of group III metal to group III nitride in a fused metal containing group III elements, with the addition of nitrogen to the fused metal containing group III elements, at temperatures $\leq 1100°$ C. and at pressures $\leq 1\times10^8$ Pa, is characterised in that at least one element among the following elements C, Si, Ge, Fe and/or at least one element from the rare earths or an alloy or compound of these elements, particularly their nitrides, is added to the fused metal containing group III elements as the solvent adjunct.

The nitrogen is introduced in the form of a gaseous substance containing nitrogen, for example ammonia ($NH_3$) or hydrazine ($H_2N$—$NH_2$), and/or in the form of a solid containing nitrogen, for example GaN, in an atmosphere containing nitrogen ($N_2$).

The concentration of the solvent adjunct in the group III fused metal, the process temperature, the process pressure and the nitrogen introduction are in this case selected as a function of the solvent adjunct used. This poses no problems to the person skilled in the art.

The addition of a solvent adjunct according to the invention results not only in an increase in the conversion of group III metal to group III nitride in the liquid group III fused metal but also in additional effects in the solution cultivation process. For example, depending on the choice of solvent adjunct, the growth kinetics, the germination or the surface tension of the fused metal containing group III elements are influenced to such an extent that the formation of large iso-structural group III nitride volume crystals or crystal layers is possible.

BRIEF DESCRIPTION OF THE DRAWINGS

The invention is described below, by way of an example, without limiting the general concept of the invention on the basis of an exemplary embodiment in which germanium (Ge) is used as the solvent adjunct, with reference to the drawings.

METHODS OF IMPLEMENTING THE INVENTION

A composition of the group III fused metal, consisting of the group III metal gallium (Ga) and the group IV semi-metal germanium (Ge), is used as solvent adjunct in a plurality of tests, and initially melted as a homogeneous fused metal.

Figure 1:
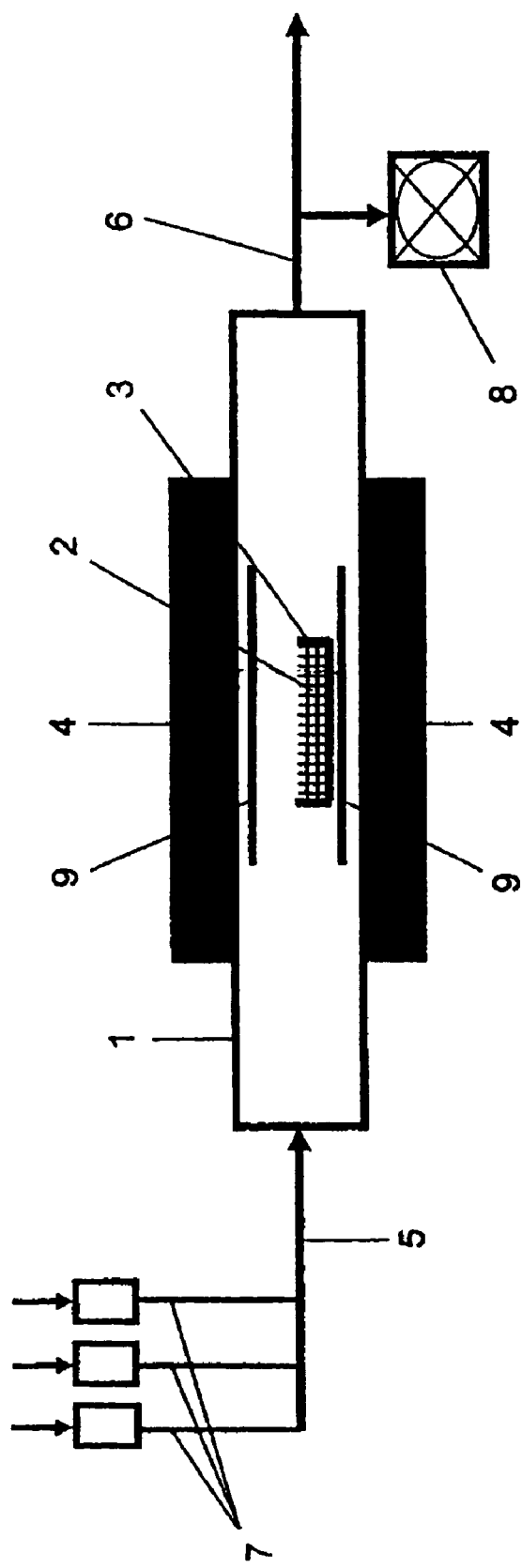
FIG. 1 schematised cross-sectional representation of the model reactor.

The tests are carried out in a model reactor which is represented diagrammatically in FIG. 1. It consists of a sealable quartz glass ampoule 1 which is surrounded on the outside by a tube furnace 4 in the direction of its longitudinal axis. A sample of fused metal 2 according to the invention is present in a boat 3 of boron nitride or quartz glass inside quartz glass ampoule 1. The boat is arranged in a quartz glass liner 9 inside quartz glass ampoule 1. Quartz glass ampoule 1 has a gas feed pipe 5 for admitting the carrier gas and a reactive gaseous substance containing nitrogen, together with an exhaust air discharge 6. The admission of the in-flowing gases is controlled by mass flow regulators 7. Throughout all the tests the carrier gas consists of nitrogen ($N_2$), ammonia ($NH_3$) being used as the reactive substance containing nitrogen. The mixing ratio $N_2NH_3$ of 4:1 is kept constant throughout all the tests. Exhaust air discharge 6 is connected to a turbomolecular pump 8 with which the quartz glass ampoule can be evacuated.

In order to determine the conversion of Ga to GaN in sample 2, sample 2 used is weighed both before and after the test. The variation in weight of sample 2 serves as a determination parameter for the conversion of Ga to GaN, assuming that the entire weight increase results from the conversion of Ga to GaN. The accuracy of this assumption is tested by means of X-ray phase analysis. Two to three hours are chosen as the time for each test. The flow rate of the gases is chosen so that there is a complete exchange of gas atmosphere in quartz glass ampoule 1 within half an hour.

A plurality of tests is carried out, the reaction temperature varying from 930° C. to 970° and the ratio of Ge to Ga in the fused metal containing Ga carrying under otherwise identical conditions.

Figure 2:
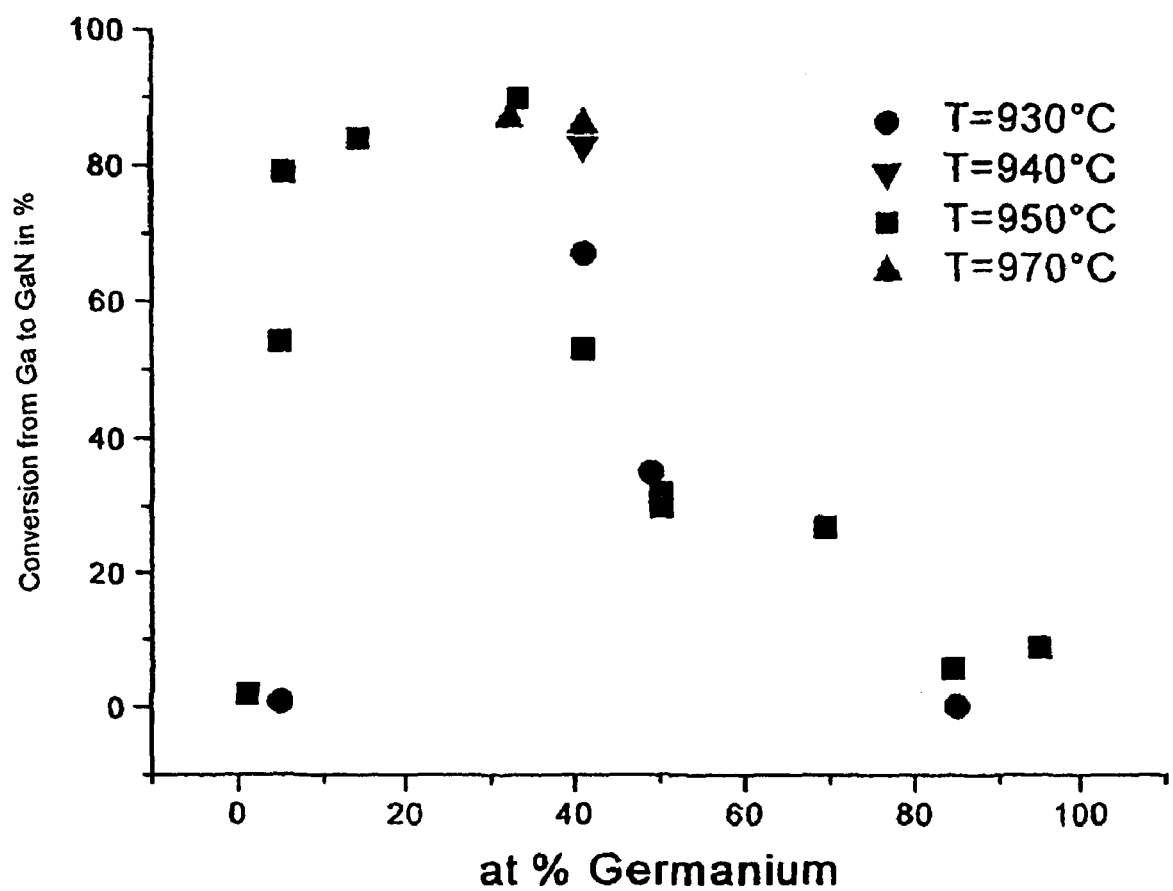
FIG. 2 representation of the conversion of Ga to GaN as a percentage as a function of the Ge content of the Ga fused meal.

FIG. 2 shows graphically the evaluation of the test results. It shows the conversion of Ga to GaN as a percentage as a function of the Ge content of the fused metal containing Ga at different reaction temperatures T. It can be clearly seen that as the Ge content in the fused metal increases to 10%, the conversion of Ga to GaN initially increases sharply by approx. 80%, that at Ge contents of between 10%-40% the conversion of Ga to GaN only increases slightly to 90%, and then drops sharply again at higher Ge contents.

This therefore demonstrates that Ge gives rise to a considerable increase in conversion of Ga to GaN in a fused metal containing Ga at temperatures $\leq 1100°$ C. and at pressures of below $1\times10^8$ Pa, particularly at ambient pressure, as a solvent adjunct according to the invention in a Ga fused metal under suitable process conditions.

If Ge is added as a solvent adjunct to a group III fused metal, large iso-structural group III nitride volume crystals or crystal layers with a diameter>10 mm or crystal layers with thicknesses>10 µm, and dislocation densities $\leq 10^8$ $cm^{-2}$ can be produced under suitable solution cultivation process conditions.

List of reference numbers

| | |
|---|---|
| 1 | Quartz glass ampoule |
| 2 | Sample of a group III fused metal with solvent adjunct |
| 3 | Boat |
| 4 | Tube furnace |
| 5 | Gas feed pipe |
| 6 | Exhaust air discharge |
| 7 | Mass flow regulator |
| 8 | Turbomolecular pump |
| 9 | Quartz glass liner |

The invention claimed is:

1. A method for increasing the conversion of group III metal to group III nitride in a fused metal containing group III elements, with the introduction of nitrogen into the fused metal containing group III elements, at temperatures<1100° C. and at pressures below $1\times10^8$ Pa, wherein a solvent adjunct, which contains element C or an alloy or a compound of this element, particularly its nitrides, is added to the fused metal containing group III elements.

2. The method according to claim 1, characterised in that the introduction of nitrogen in the fused metal takes place in the form of a gas mixture which consists of a carrier gas and a reactive substance containing nitrogen, wherein a mixture of nitrogen ($N_2$) and hydrogen ($H_2$) is used as the carrier gas, and ammonia ($NH_3$) or hydrazine ($H_2N$—$NH_2$) is used as the reactive substance containing nitrogen.

3. The method according to claim 1, characterised in that the nitrogen introduction in the fused metal takes place in the form of a solid containing nitrogen in a nitrogen atmosphere ($N_2$).

4. The method according to claim 3, characterised in that GaN is used as the solid containing nitrogen.

5. The method according to claim 1, characterised in that the method is used for producing crystal layers or volume crystals from iso-structural group III nitride or from mixtures of different group III nitrides by precipitation from a fused metal containing group III elements.

6. A method for increasing the conversion of gallium to gallium nitride in a fused metal containing gallium, with the introduction of nitrogen into the fused metal containing gallium, at temperatures<1100° C. and at pressures below $1\times10^8$ Pa, wherein a solvent adjunct, which contains at least Ge or an alloy or a compound of this element, particularly its nitrides, is added to the fused metal containing gallium and by which a Ge content in the fused metal containing gallium of between 5 to 40 atomic % is achieved.

7. The method according to claim 6, characterised in that the introduction of nitrogen in the fused metal takes place in the form of a gas mixture which consists of a carrier gas and a reactive substance containing nitrogen, wherein a mixture of nitrogen ($N_2$) and hydrogen ($H_2$) is used as the carrier gas, and ammonia ($NH_3$) or hydrazine ($H_2N$—$NH_2$) is used as the reactive substance containing nitrogen.

8. The method according to claim 6, characterised in that the nitrogen introduction in the fused metal takes place in the form of a solid containing nitrogen in a nitrogen atmosphere ($N_2$).

9. The method according to claim 8, characterised in that GaN is used as the solid containing nitrogen.

10. The method according to claim 6, characterised in that the method is used for producing crystal layers or volume crystals from iso-structural gallium nitride by precipitation from a fused metal containing gallium.

11. A method for increasing the conversion of group III metal to group III nitride in a fused metal containing group III elements, with the introduction of nitrogen into the fused metal containing group III elements, at temperatures<1100° C. and at pressures below $1\times10^8$ Pa, wherein a solvent adjunct, which contains at least one element of the following elements C and Ge or an alloy or a compound of these elements, particularly their nitrides, is added to the fused metal containing group III elements, characterised in that the nitrogen introduction in the fused metal takes place in the form of a solid containing nitrogen in a nitrogen atmosphere ($N_2$).

12. The method according to claim 11, characterised in that GaN is used as the solid containing nitrogen.

* * * * *

UNITED STATES PATENT AND TRADEMARK OFFICE
CERTIFICATE OF CORRECTION

| | | |
|---|---|---|
| PATENT NO. | : 7,883,645 B2 | Page 1 of 1 |
| APPLICATION NO. | : 11/664370 | |
| DATED | : February 8, 2011 | |
| INVENTOR(S) | : Friedrich et al. | |

It is certified that error appears in the above-identified patent and that said Letters Patent is hereby corrected as shown below:

In Column 4, line 2 (Claim 1, line 4) the typographical character "<" should read -- ≤ --;

In Column 4, line 28 (Claim 6, line 4) the typographical character "<" should read -- ≤ --; and In Column 4, line 55 (Claim 11, line 4) the typographical character "<" should read -- ≤ --.

Signed and Sealed this
Fourth Day of October, 2011

David J. Kappos
*Director of the United States Patent and Trademark Office*